US012588377B2

(12) United States Patent
Koo et al.

(10) Patent No.: US 12,588,377 B2
(45) Date of Patent: Mar. 24, 2026

(54) DISPLAY DEVICE

(71) Applicant: Samsung Display Co., LTD., Yongin-si (KR)

(72) Inventors: Bon-Yong Koo, Yongin-si (KR); Sujin Lee, Yongin-si (KR); Danwon Lim, Yongin-si (KR); Jaeyong Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 387 days.

(21) Appl. No.: 18/313,805

(22) Filed: May 8, 2023

(65) Prior Publication Data

US 2023/0413625 A1 Dec. 21, 2023

(30) Foreign Application Priority Data

Jun. 21, 2022 (KR) ........................ 10-2022-0075832

(51) Int. Cl.
*H10K 59/131* (2023.01)
(52) U.S. Cl.
CPC .................................. *H10K 59/131* (2023.02)
(58) Field of Classification Search
CPC ..................................................... H10K 59/131
See application file for complete search history.

(56) References Cited

U.S. PATENT DOCUMENTS

| | | | | |
|---|---|---|---|---|
| 10,121,986 | B2 | 11/2018 | Lee et al. | |
| 10,514,814 | B2 | 12/2019 | Fu et al. | |
| 2014/0117320 | A1* | 5/2014 | Jung | H10K 59/131 |
| | | | | 257/40 |
| 2019/0386032 | A1* | 12/2019 | Hsu | G02F 1/13458 |
| 2021/0066350 | A1 | 3/2021 | Cheng | |
| 2021/0359074 | A1 | 11/2021 | You et al. | |
| 2021/0376279 | A1 | 12/2021 | Jeon et al. | |

FOREIGN PATENT DOCUMENTS

| | | |
|---|---|---|
| KR | 10-2020-0112983 A | 10/2020 |
| KR | 10-2021-0140837 A | 11/2021 |

* cited by examiner

*Primary Examiner* — Douglas M Menz
(74) *Attorney, Agent, or Firm* — Womble Bond Dickinson (US) LLP

(57) ABSTRACT

One or more embodiments of the present disclosure provides a display device including: a substrate configured to include a display area including pixels and signal lines, and a peripheral area positioned around the display area; a semiconductor layer on the substrate; a first conductive layer between the semiconductor layer and the substrate; a second conductive layer positioned between the first conductive layer and the semiconductor layer; a gate conductive layer on the semiconductor layer; and a third conductive layer on the gate conductive layer, wherein the peripheral area includes a fan-out portion in which fan-out wires connected to the signal lines are positioned, and the fan-out wires include a first fan-out wire, a second fan-out wire, and a third fan-out wire which are alternately positioned in different ones among the first conductive layer, the second conductive layer, and the gate conductive layer.

20 Claims, 5 Drawing Sheets

DISPLAY DEVICE

CROSS-REFERENCE TO RELATED APPLICATION

This application claims priority to, and the benefit of, Korean Patent Application No. 10-2022-0075832, filed in the Korean Intellectual Property Office on Jun. 21, 2022, the entire contents of which are incorporated herein by reference.

BACKGROUND

1. Field

The present disclosure relates to a display device.

2. Description of the Related Art

A display device may include a display area capable of displaying an image, and a peripheral area adjacent to the display area. A plurality of pixels, which are units for displaying an image, and signal lines, such as scan lines and data lines electrically connected to the pixels, are positioned in the display area.

Each of the pixels may include at least one light emitting diode. Electrons injected from one electrode included in a light emitting diode, and holes injected from another electrode, are combined in an emission layer to form excitons. The excitons output energy and emit light while changing from an excited state to a ground state.

A plurality of transistors and one or more capacitors for driving a light emitting diode are formed in each pixel. A transistor includes a semiconductor layer including a semiconductor material, such as an oxide semiconductor, polycrystalline silicon, amorphous silicon, or the like. The semiconductor layer may include a channel region and a conductive region doped with impurities.

A wiring area connected to a signal line of the display area is positioned in the peripheral area.

The above information disclosed in this Background section is only for enhancement of understanding of the background of the present disclosure, and therefore, it may contain information that does not form the prior art.

SUMMARY

Embodiments of the present disclosure reduce a dead space caused by a wiring area positioned in a peripheral area of the display device, and also improve a filling rate of a data line.

One or more embodiments of the present disclosure provides a display device including a substrate including a display area including pixels and signal lines, and a peripheral area around the display area and including a fan-out portion including a first fan-out wire, a second fan-out wire, and a third fan-out wire connected to respective ones of the signal lines, a semiconductor layer above the substrate, a first conductive layer between the semiconductor layer and the substrate, and including the second fan-out wire, a second conductive layer between the first conductive layer and the semiconductor layer, and including the third fan-out wire, a gate conductive layer above the semiconductor layer, and including the first fan-out wire, and a third conductive layer above the gate conductive layer.

A first voltage range of a signal transferred by the first fan-out wire, a second voltage range of the signal transferred by the second fan-out wire, and a third voltage range of the signal transferred by the third fan-out wire may be different from each other.

The first conductive layer, the second conductive layer, and the gate conductive layer may have different sheet resistances or specific resistances, respectively.

The sheet resistances or the specific resistances may decrease in order of the second fan-out wire, the first fan-out wire, and the third fan-out wire, wherein the voltage ranges increase in an order of the second voltage range, the first voltage range, and the third voltage range.

The sheet resistances or the specific resistances may decrease in an order of the first conductive layer, the gate conductive layer, and the second conductive layer.

A color displayed by a first pixel connected to a first signal line to which the first fan-out wire is connected, a color displayed by a second pixel connected to a second signal line to which the second fan-out wire is connected, and a color displayed by a third pixel connected to a third signal line to which the third fan-out wire is connected, may be different from each other.

The first pixel may be configured to display green, the second pixel may be configured to display red, and the third pixel may be configured to display blue.

The third conductive layer may include a voltage line positioned in the fan-out portion and configured to transmit a driving voltage to the display area.

Any other conductive layer than the first conductive layer, the second conductive layer, and the gate conductive layer may not be positioned between the substrate and the third conductive layer.

The display device may further include a light emitting diode above the third conductive layer.

At least portions of the first conductive layer and the second conductive layer may overlap the semiconductor layer in a plan view, wherein the first conductive layer and the second conductive layer overlap each other at least partially.

The first conductive layer may include a first portion and a second portion connected to each other, wherein the second conductive layer includes a first conductive pattern overlapping the first portion to form a first capacitor, and a second conductive pattern overlapping the second portion to form a second capacitor.

The gate conductive layer may include a gate electrode overlapping the semiconductor layer, wherein the gate electrode is electrically connected to the first conductive layer.

One or more embodiments of the present disclosure provide a display device including a substrate including a display area including pixels including a first pixel array, a second pixel array, and a third pixel array respectively representing different colors, and signal lines including a first signal line connected to the first pixel array, a second signal line connected to the second pixel array, and a third signal line connected to the third pixel array, and a peripheral area around the display area, and including a fan-out portion including a first fan-out wire in a gate conductive layer above the substrate, and connected to the first signal line, a second fan-out wire in a first conductive layer above the substrate, and connected to the second signal line, and a third fan-out wire in a second conductive layer above the substrate, and connected to the third signal line.

A first voltage range of a signal transferred by the first fan-out wire, a second voltage range of the signal transferred by the second fan-out wire, and a third voltage range of the signal transferred by the third fan-out wire may be different from each other.

The first conductive layer, the second conductive layer, and the gate conductive layer may have different sheet resistances or specific resistances, respectively.

The sheet resistances or the specific resistances may decrease in an order of the second fan-out wire, the first fan-out wire, and the third fan-out wire, wherein the voltage ranges increase in an order of the second voltage range, the first voltage range, and the third voltage range.

The first pixel array may be configured to display green, the second pixel array is configured to display red, and the third pixel array is configured to display blue.

One or more embodiments of the present disclosure provide a display device including a substrate including a display area including pixels and signal lines, and a peripheral area positioned around the display area, and including a fan-out portion in which fan-out wires are connected to the signal lines to transmit signals of different voltage ranges, and a first conductive layer, a second conductive layer, and a gate conductive layer positioned above the substrate, and having respective sheet resistances or specific resistances, wherein the fan-out wires are positioned on respective ones among the first conductive layer, the second conductive layer, and the gate conductive layer depending on a magnitude of voltage ranges of the signals respectively transferred by the fan-out wires.

The sheet resistances or the specific resistances of the fan-out wires, respectively, may be inversely proportional to respective voltage ranges of signals transferred by the fan-out wires.

According to the embodiments, it is possible to reduce a dead space caused by a wiring area positioned in a peripheral area of the display device, and it is possible to improve a filling rate of a data line.

DETAILED DESCRIPTION

Figure 1:
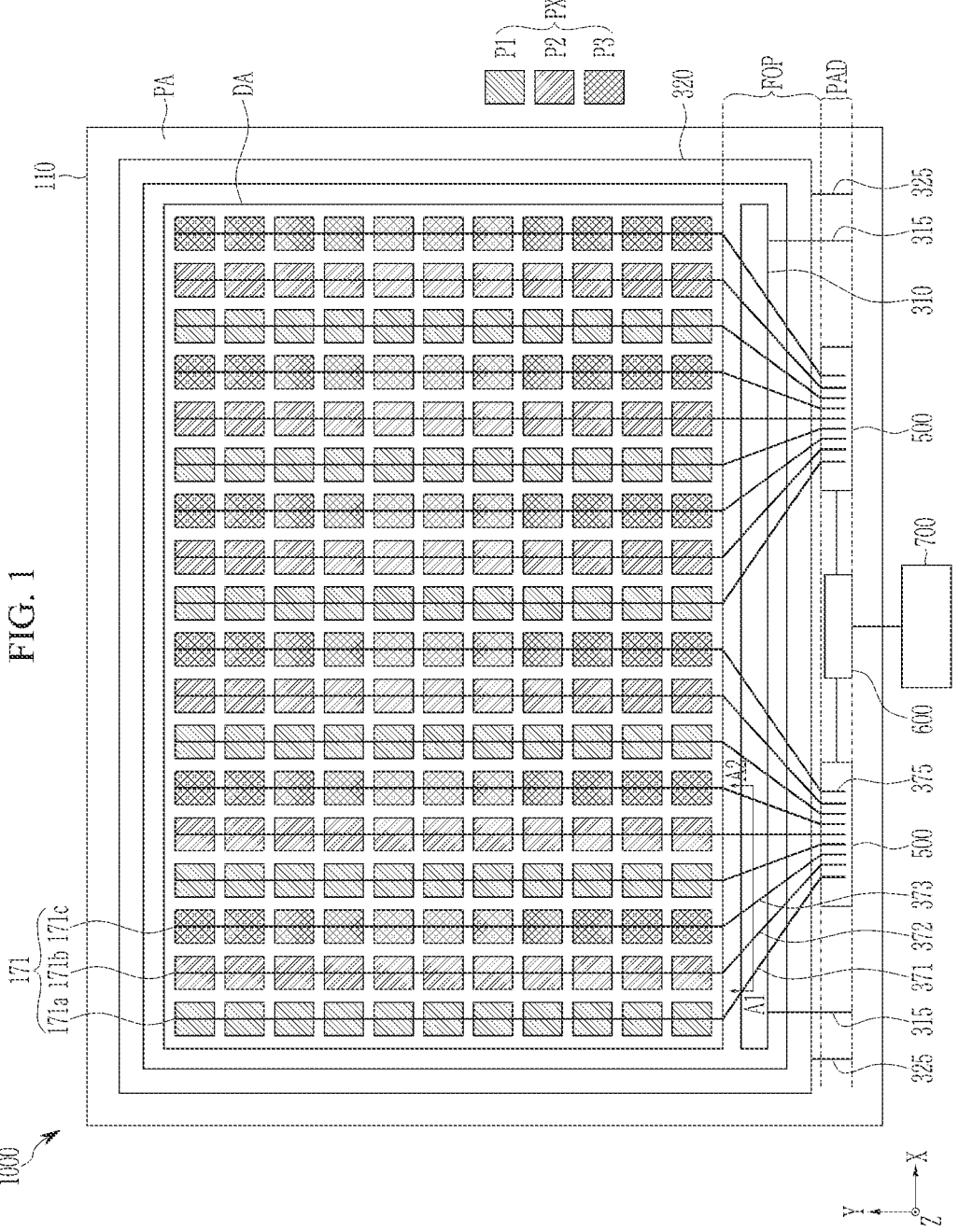
FIG. 1 illustrates a top plan view of a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A display device according to one or more embodiments will now be described with reference to FIG. 1.

FIG. 1 illustrates a top plan view of a display device according to one or more embodiments.

Referring to FIG. 1, the display device 1000 according to one or more embodiments includes a substrate 110, and each of the display device 1000 and the substrate 110 includes a display area DA and a peripheral area PA positioned around the display area DA. The display area DA and the peripheral area PA may be positioned on one substrate 110.

The display area DA is an area capable of displaying an image and includes a plurality of pixels PX and a plurality of signal lines.

The pixels PX may be arranged in a regular manner, like a matrix form. The pixels PX include different pixels P1, P2, and P3 capable of displaying different respective colors. For example, the first pixel P1 may represent red, the second pixel P2 may represent green, and the third pixel P3 may represent blue, but the colors represented by the respective pixels P1, P2, and P3 are not limited thereto. The pixels PX may be positioned in a plurality of pixel arrays. The pixel arrays may include a first pixel array in which first pixels P1 are arranged, a second pixel array in which second pixels P2 are arranged, and a third pixel array in which third pixels P3 are arranged. The first pixel array in which the first pixels P1 are arranged, the second pixel array in which the second pixels P2 are arranged, and the third pixel array in which the third pixels P3 are arranged may be alternately arranged along an X direction.

In the present embodiments, three pixels P1, P2, and P3 representing different colors have been described as an example, but a number of pixels representing different colors is not limited thereto.

One pixel PX may include a pixel circuit including a plurality of transistors connected to a signal line, at least one capacitor, and a light emitting diode. The pixel circuit including the signal line, the transistors, the capacitor, the light emitting diode, and the like may be positioned on the substrate 110.

A plurality of signal lines positioned in the display area DA may include a plurality of data lines 171 that transfer data signals to each pixel PX. The data lines 171 may include a first data line 171*a* extending along the pixel array in which the first pixels P1 are arranged, a second data line 171*b* extending along the pixel column in which the second pixels P2 are arranged, and a third data line 171*c* extending along the pixel column in which the third pixels P3 are arranged. Each of the data lines 171*a*, 171*b*, and 171*c* may extend along a Y direction that is different from the X direction.

The peripheral area PA may include a first voltage line 310, a second voltage line 320, a pad portion PAD, and a fan-out portion FOP.

The first voltage line 310 may be, for example, a driving voltage wire that transfers a driving voltage. The first voltage line 310 may be connected to the pixel PX of the display area DA to transfer a driving voltage. The first voltage line 310 may be positioned in the peripheral area PA adjacent to one side of the display area DA in FIG. 1, and may extend in the X direction.

The second voltage line 320 may be, for example, a common voltage wire that transfers a common voltage. The second voltage line 320 may transfer the common voltage to the light emitting diode of the pixel PX of the display area DA. The second voltage line 320 may be positioned in the peripheral area PA adjacent to one side of the display area DA in FIG. 1. The second voltage line 320 may extend along a circumference of the display area DA. For example, the second voltage line 320 may extend along the circumference of the display area DA to form a loop shape surrounding at least a portion of the display area DA. The second voltage line 320 may include a portion adjacent to the first voltage line 310 in the Y direction, and extending in the X direction. Referring to FIG. 1, the first voltage line 310 may be positioned between the display area DA and a portion of the second voltage line 320 that is adjacent to the first voltage line 310 in the Y direction, and may extend in the X direction.

The pad portion PAD may be positioned on one side of the substrate 110. At least one driver 500, or a circuit board on which the driver 500 is mounted, may be positioned on the pad portion PAD to be electrically connected to a plurality of pads of the pad portion PAD. FIG. 1 illustrates the display device 1000 in which two drivers 500 are connected to the pad portion PAD as one or more embodiments.

The pads may include a pad 375 connected to the data lines 171, a pad 315 connected to the first voltage line 310, and a pad 325 connected to the second voltage line 320. The pads may be arranged in the X direction, but the present disclosure is not limited thereto. According to one or more embodiments, the pads may be positioned in a plurality of rows, or may be positioned in a zigzag manner along the X direction.

The display device according to one or more embodiments may further include a signal controller 600 and a processor 700. The signal controller 600 may control a signal and data supplied from the processor 700 to transfer it to the driver 500.

The driver 500 may generate a control signal, a driving voltage, a common voltage, a data voltage, and the like to transfer them to the control signal line, to the first voltage line 310, to the second voltage line 320, and to the data line 171 positioned in the peripheral area PA.

The driver 500, the signal controller 600, and the processor 700 may be formed as separate integrated circuits (ICs) as illustrated in FIG. 1, and at least some of them may be integrated in the form of one IC.

The fan-out portion FOP includes a plurality of fan-out wires 371, 372, and 373. The fan-out wires 371, 372, and 373 may transfer a data signal received through the pad 375 of the pad portion PAD to the data lines 171 of the display area DA. The fan-out wires 371, 372, and 373 may extend in a direction that is different from the X and Y directions. The fan-out wires 371, 372, and 373 may extend in different directions depending on a portion or location thereof with respect to the X direction, but the present disclosure is not limited thereto. The fan-out wires 371, 372, and 373 may include a first fan-out wire 371, a second fan-out wire 372, and a third fan-out wire 373 arranged alternately along the X direction.

The fan-out wires 371, 372, and 373 may be respectively connected to data lines 171*a*, 171*b*, and 171*c* connected to columns of pixels P1, P2, and P3 representing different respective colors. For example, the first fan-out wire 371 may be connected to the first data line 171*a*, the second fan-out wire 372 may be connected to the second data line 171*b*, and the third fan-out wire 373 may be connected to the third data line 171c. A configuration and number of repeated fan-out wires 371, 372, and 373 may vary depending on a number of pixels P1, P2, and P3 of different colors.

Lower ends of the fan-out wires 371, 372, and 373 of the fan-out portion FOP may be connected to each pad 375 or may form the pad 375. The fan-out portion FOP may be positioned between the pad portion PAD and the display area DA.

The fan-out wires 371, 372, and 373 of the fan-out portion FOP may be positioned in different conductive layers on the substrate 110. This will be described in detail below.

An example of a structure of the pixel PX according to one or more embodiments will be described with reference to FIG. 2 together with FIG. 1.

Figure 2:
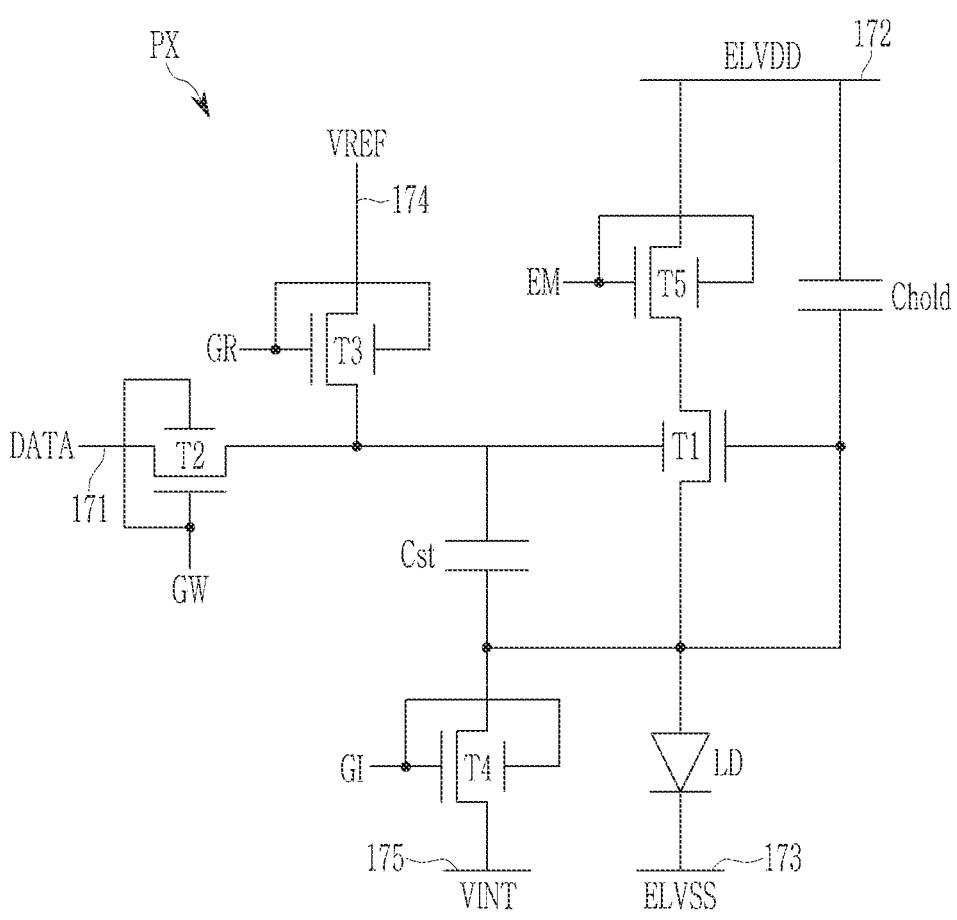
FIG. 2 illustrates a circuit diagram of a pixel of a display device according to one or more embodiments.

FIG. 2 illustrates a circuit diagram of a pixel of a display device according to one or more embodiments.

A pixel circuit of one pixel PX includes a plurality of transistors T1, T2, T3, T4, and T5 connected to several signal lines 171, 172, 173, 174, and 175, a first capacitor Cst, a second capacitor Chold, and a light emitting diode LD. The transistors T1, T2, T3, T4, and T5 may include a first transistor T1, a second transistor T2, a third transistor T3, a fourth transistor T4, and a fifth transistor T5. At least some of the transistors T1, T2, T3, T4, and T5 may have a dual-gate structure. FIG. 2 illustrates an example in which all transistors T1, T2, T3, T4, and T5 have a dual-gate structure, but the present disclosure is not limited thereto.

The signal lines 171, 172, 173, 174, and 175 may include a data line 171 for transferring a data signal DATA, a driving voltage line 172 for transferring a driving voltage ELVDD, a common voltage line 173 for transferring a common voltage ELVSS to a cathode of a light emitting diode LD, a reference voltage line 174 for transferring a reference voltage VREF, and an initialization voltage line 175 for transferring an initialization voltage VINT. Luminance of the light emitting diode LD may be changed depending on a data signal transferred through the data line 171.

The first transistor T1 may be a driving transistor that supplies a driving current corresponding to the data signal DATA to the light emitting diode LD. The first transistor T1 may include an oxide semiconductor. The first terminal of the first transistor T1 may be connected to the driving voltage line 172 via the fifth transistor T5. The second terminal of the first transistor T1 is connected to an anode of the light emitting diode LD. A first terminal and a second terminal of a transistor may indicate a source region (or a source electrode) or a drain region (or a drain electrode), and may include a conductive region of the semiconductor layer or an electrode connected to the conductive region. The first transistor T1 may include a dual-gate terminal. A first gate terminal of the first transistor T1 may be connected to a first end of the first capacitor Cst, to the second transistor T2, and to the third transistor T3. A second gate terminal of the first transistor T1 may be connected to a second terminal of the first transistor T1, to the anode of the light emitting diode LD, to a second end of the first capacitor Cst, and to a first end of the second capacitor Chold.

In the first transistor T1, a voltage of the first gate terminal of the first transistor T1 changes depending on a voltage stored in the first capacitor Cst, and accordingly, a driving current outputted by the first transistor T1 and flowing to the light emitting diode LD may be controlled.

The second transistor T2 may be a switching transistor that transfers the data signal DATA to the first transistor T1 in response to a first scan signal GW. The second transistor T2 may include an oxide semiconductor. A first terminal of the second transistor T2 may be connected to the data line

171, and the second terminal may be connected to the first gate terminal of the first transistor T1, to the second end of the first capacitor Cst, and to the third transistor T3. The second transistor T2 may include a dual-gate terminal. A first gate terminal and a second gate terminal of the second transistor T2 may be connected to each other and may receive the first scan signal GW. When the second transistor T2 is turned on according to the first scan signal GW, the data signal DATA that is transferred through the data line 171 may be transferred to the first gate terminal of the first transistor T1 and to the first end of the first capacitor Cst.

The third transistor T3 may be a reference voltage transistor that provides the reference voltage VREF to the first transistor T1 in response to the second scan signal GR. The third transistor T3 may include an oxide semiconductor. A first terminal of the third transistor T3 may be connected to the reference voltage line 174 that transfers the reference voltage VREF, and a second terminal thereof may be connected to the first gate terminal of the first transistor T1 and to the first end of the first capacitor Cst. The third transistor T3 may include a dual-gate terminal. A first gate terminal and a second gate terminal of the third transistor T3 may be connected to each other and may receive the second scan signal GR. When the third transistor T3 is turned on according to the second scan signal GR, the reference voltage VREF may be transferred to the first gate terminal of the first transistor T1 and to the first end of the first capacitor Cst.

The fourth transistor T4 may be an initialization transistor that provides the initialization voltage VINT to the anode of the light emitting diode LD in response to a third scan signal GI. The fourth transistor T4 may include an oxide semiconductor. A first terminal of the fourth transistor T4 may be connected to the initialization voltage line 175 that transfers the initialization voltage VINT, and a second terminal thereof may be connected to the second end of the first capacitor Cst and to the anode of the light emitting diode LD. The fourth transistor T4 may include a dual-gate terminal. A first gate terminal and a second gate terminal of the fourth transistor T4 may be connected to each other to receive the third scan signal GI. When the fourth transistor T4 is turned on according to the third scan signal GI, the initialization voltage VINT may be transferred to the second terminal of the first capacitor Cst and the anode of the light emitting diode LD to be initialized.

The fifth transistor T5 may be an emission control transistor that provides the driving voltage ELVDD to the light emitting diode LD in response to an emission control signal EM. The fifth transistor T5 may include an oxide semiconductor. A first terminal of the fifth transistor T5 may be connected to the driving voltage line 172 that transfers the driving voltage ELVDD, and a second terminal of the fifth transistor T5 may be connected to the first transistor T1. The fifth transistor T5 may include a dual-gate terminal. A first gate terminal and a second gate terminal of the fifth transistor T5 may be connected to each other and may receive the emission control signal EM. When the fifth transistor T5 is turned on according to the emission control signal EM, the driving voltage ELVDD may be transferred to the first terminal of the first transistor.

The first capacitor Cst may store voltages corresponding to the threshold voltage of the first transistor T1 and the data signal DATA. A first end of the second capacitor Chold may be connected to the second gate terminal of the first transistor T1 and to the anode of the light emitting diode LD, and a second end thereof may be connected to the driving voltage line 172. The first capacitor Cst may maintain voltages of the second gate terminal of the first transistor T1 and the anode of the light emitting diode LD.

The light emitting diode LD may include a light emitting layer positioned between the anode and the cathode.

In FIG. 2, a case in which one pixel PX includes five transistors and two capacitors has been described as an example, but the present disclosure is not limited thereto. For example, one pixel PX may include six or more transistors and one capacitor or three or more capacitors.

A cross-sectional structure of a display area of a display device according to one or more embodiments will be described with reference to FIG. 3 together with FIG. 1 and FIG. 2 described above.

Figure 3:
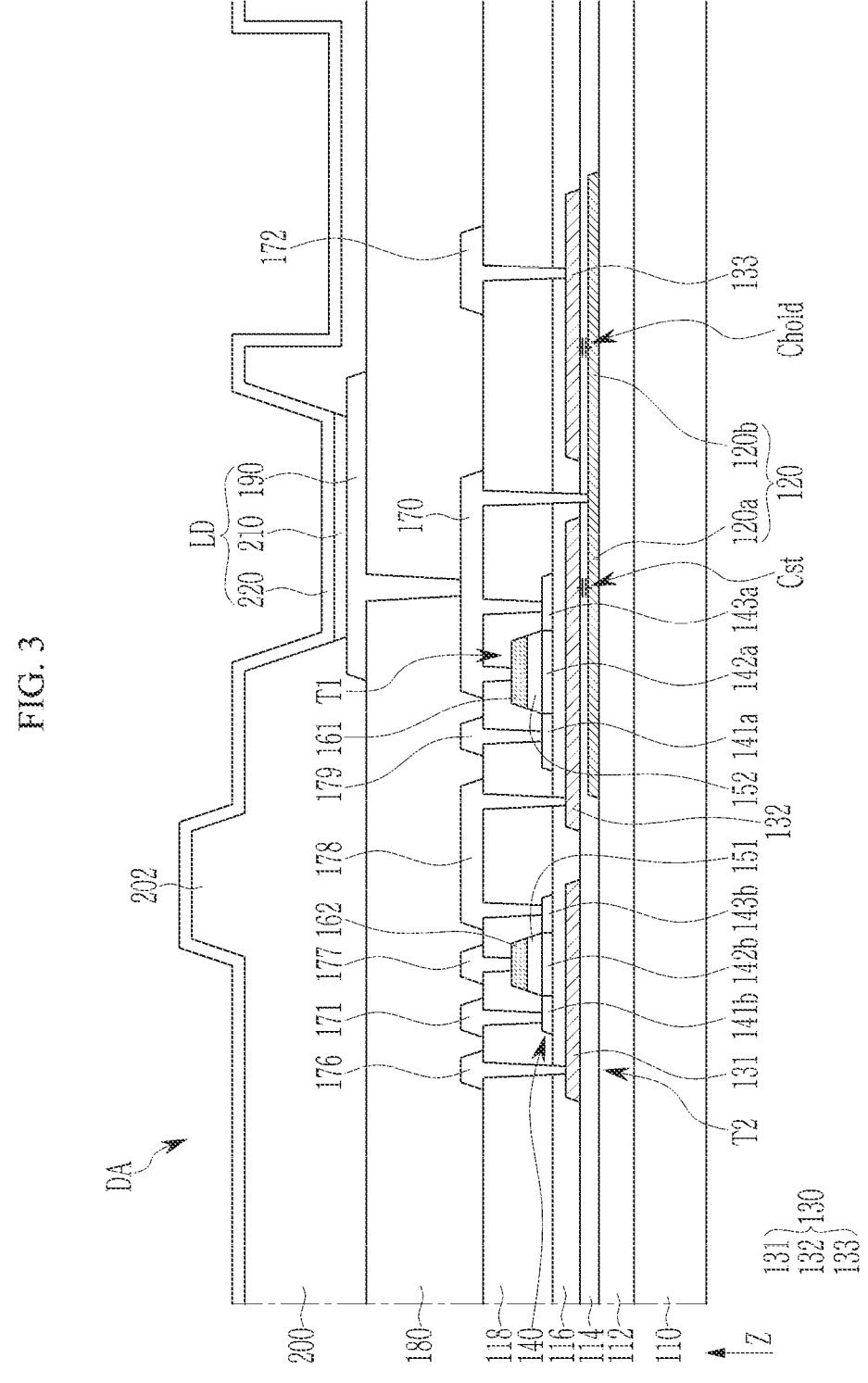
FIG. 3 illustrates a cross-sectional view of a display device according to one or more embodiments.

FIG. 3 illustrates a cross-sectional view of a display device according to one or more embodiments.

A barrier layer 112 may be located on the substrate 110. The substrate 110 may be made of an insulating material, such as glass, quartz, or a polymer resin. The substrate 110 may be a rigid substrate or a flexible substrate capable of bending, folding, rolling, or the like. The barrier layer 112, which is an insulating layer, may include an inorganic insulating material or an organic insulating material, such as a silicon oxide (SiN$_x$), a silicon nitride (SiO$_x$), and a silicon oxynitride (SiO$_x$N$_y$). Each of the substrate 110 and the barrier layer 112 may be formed as a single layer or multiple layers.

A first conductive layer 120 is positioned on the barrier layer 112. The first conductive layer 120 may include a metal such as, for example, aluminum (A1), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The first conductive layer 120 may be formed as a single layer or multiple layers. For example, the first conductive layer 120 may be a single layer including molybdenum (Mo). For example, the thickness of the first conductive layer 120 may be about 2000 angstroms, but the present disclosure is not limited thereto.

The first conductive layer 120 may be positioned directly on the barrier layer 112 to contact an upper surface of the barrier layer 112.

The first conductive layer 120 may have a light blocking characteristic or a semi-transmission characteristic. The first conductive layer 120 may include a first portion 120a and a second portion 120b, and the first portion 120a and the second portion 120b may be connected to each other and formed integrally, but the present disclosure is not limited thereto.

A second insulating layer 114 may be located on the first conductive layer 120. The first insulating layer 114 may include an inorganic insulating material or an organic insulating material, such as a silicon oxide (SiN$_x$), a silicon nitride (SiO$_x$), and a silicon oxynitride (SiO$_x$N$_y$).

A second conductive layer 130 is positioned on the first insulating layer 114. The second conductive layer 130 may include a metal such as, for example, aluminum (A1), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The second conductive layer 130 may be formed as a single layer or multiple layers. The second conductive layer 130 may include a material that is different from that of the first conductive layer 120. For example, the second conductive layer 130 may be a multi-layer including a first layer including titanium (Ti) and a second layer including aluminum (A1). For example, a thickness of the first layer in a Z direction may be about 300 angstroms, and a thickness of the second layer in the Z direction may be about 3500 angstroms, but the present disclosure is not limited thereto. The second conductive layer 130 may have a light blocking characteristic or a semi-transmission characteristic.

The second conductive layer 130 may have sheet resistance or specific resistance that is different from that of the first conductive layer 120. For example, the sheet resistance or specific resistance of the second conductive layer 130 may be less than the sheet resistance or specific resistance of the first conductive layer 120.

The second conductive layer 130 may be positioned directly on the first insulating layer 114 to be in contact with an upper surface of the first insulating layer 114.

The second conductive layer 130 may include a same material as the first conductive layer 120, or may include a different material therefrom.

At least portions of the first conductive layer 120 and the second conductive layer 130 may overlap each other. At least one of the first conductive layer 120 and the second conductive layer 130 may reduce or prevent deterioration of characteristics of the transistor due to light reaching the semiconductor layer of at least one thin film transistor, which will be described later, by reducing or blocking light that is incident from the substrate 110 or that is incident from above and reflected from below, The second conductive layer 130 may include a first conductive pattern 131, a second conductive pattern 132, and a third conductive pattern 133 that are spaced apart and that are insulated from each other. The first conductive pattern 131 may overlap a semiconductor layer 140 of the second transistor T2. The second conductive pattern 132 may overlap a semiconductor layer 140 of the first transistor T1.

The third conductive pattern 133 may overlap the second portion 120b of the lower first conductive layer 120 to form the second capacitor Chold. In this case, the second portion 120b of the first conductive layer 120 may form a first end of the second capacitor Chold, and the third conductive pattern 133 may form a second end of the second capacitor Chold.

The second conductive pattern 132 may overlap the first portion 120a of the lower first conductive layer 120 to form the first capacitor Cst. In this case, the first portion 120a of the first conductive layer 120 may form the first end of the first capacitor Cst, and the second conductive pattern 132 may form the second end of the first capacitor Cst.

A buffer layer 116 may be located on the second conductive layer 130. The buffer layer 116, which is an insulating layer, may include an inorganic insulating material or an organic insulating material, such as a silicon oxide (SiN$_x$), a silicon nitride (SiO$_x$), and a silicon oxynitride (SiO$_x$N$_y$).

A semiconductor layer 140 may be located on the buffer layer 116. The semiconductor layer 140 may include various semiconductor materials, such as polycrystalline silicon, amorphous silicon, and an oxide semiconductor, but in the present embodiments, a case including the oxide semiconductor will be described as an example. The semiconductor layer 140 includes a channel region of the transistor described above, and conductive regions (source region or drain region) positioned at opposite sides of the channel region and doped with impurities. Referring to FIG. 3, the semiconductor layer 140 may include a channel region 142a of the first transistor T1 and conductive regions 141a and 143a at opposite sides of the channel region 142a, and a channel region 142b of the second transistor T2 and conductive regions 141b and 143b at opposite sides of the channel region 142b. The conductive region 141a of the first transistor T1 may form the first terminal described above, and the conductive region 143a may form the second terminal. The conductive region 141b of the second transistor T2 may form the first terminal described above, and the conductive region 143b may form the second terminal.

Gate insulating layers 151 and 152 may be located on the semiconductor layer 140. The gate insulating layers 151 and 152 may each include an inorganic insulating material, such as a silicon nitride (SiN$_x$), a silicon oxide (SiO$_x$), and a silicon oxynitride (SiO$_x$N$_y$). The gate insulating layers 151 and 152 may each be formed as a multilayer or a single layer. As illustrated in FIG. 3, the gate insulating layers 151 and 152 may be respectively positioned on the channel regions 142a and 142b of the semiconductor layers 140 of the transistors T1 and T2. Each of the gate insulating layers 151 and 152 positioned to correspond to each of the channel regions 142a and 142b may not overlap most of the conductive regions 141a and 143a and 141b and 143b respectively positioned at opposite sides of the corresponding channel regions 142a and 142b. In this case, each of the gate insulating layers 151 and 152 may be referred to as a gate insulating pattern. However, the present disclosure is not limited thereto, and the gate insulating layers 151 and 152 may be formed on an entire surface of the substrate 110 like an insulating layer, such as the buffer layer 116.

A gate conductive layer including gate electrodes 161 and 162 of each of the transistors T1 and T2 may be located on the gate insulating layers 151 and 152, respectively. The gate conductive layer may have a single-layer or multi-layered structure. The gate conductive layer may include a metal material, such as molybdenum (Mo), aluminum (A1), copper (Cu), and/or titanium (Ti). The gate conductive layer may include a material that is different from that included by the first conductive layer 120 and the second conductive layer 130. For example, the gate conductive layer may be a multilayer including a first layer including molybdenum (Mo) and a second layer including titanium (Ti). For example, a thickness of the first layer in a Z direction may be about 2500 angstroms, and the thickness of the second layer in the Z direction may be about 300 angstroms, but the present disclosure is not limited thereto.

The gate conductive layer may have sheet resistance or specific resistance that is different from that of the first conductive layer 120 and the second conductive layer 130. For example, the sheet resistance or specific resistance of the gate conductive layer may be greater than the sheet resistance or specific resistance of the first conductive layer 120 and less than the sheet resistance or specific resistance of the second conductive layer 130.

The gate electrode 161 of the first transistor T1, which is the second gate terminal described above, may overlap the channel region 142a of the first transistor T1, and the gate electrode 162 of the second transistor T2 may overlap the channel region 142b of the second transistor T2. The second conductive pattern 132 of the second conductive layer 130 overlapping the channel region 142a of the semiconductor layer 140 of the first transistor T1 may form the first gate terminal of the first transistor T1. The first conductive pattern 131 of the second conductive layer 130 overlapping the channel region 142b of the semiconductor layer 140 of the second transistor T2 may form a dual-gate terminal of the second transistor T2 together with the gate electrode 162.

The gate insulating layers 151 and 152 may have edges that are aligned with the edges of a respective one of the gate electrodes 161 and 162, and may be mainly located between the gate electrodes 161 and 162 and the semiconductor layer 140, but the present disclosure is not limited thereto.

A second insulating layer 118 may be located on the buffer layer 116 and the gate conductive layer. The second insulating layer 118 may have a single-layered or multi-layered structure. The second insulating layer 118 may include an inorganic insulating material or organic insulating material, such as a silicon nitride (SiN$_x$), a silicon oxide (SiO$_x$), and a silicon oxynitride (SiO$_x$N$_y$).

According to one or more embodiments, any other conductive layer other the first conductive layer 120, the second conductive layer 130, and the gate conductive layer may not be located between the second insulating layer 118 and the substrate 110.

A third conductive layer may be located on the second insulating layer 118. The third conductive layer may include a data line 171, a driving voltage line 172, and a plurality of connection electrodes 170, 176, 177, 178, and 179. The third conductive layer may have a single or multi-layered structure. The second insulating layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and the like, and may be a single layer or multiple layers. For example, the third conductive layer may include a first layer including titanium, a second layer including aluminum, and a third layer including titanium. For example, a thickness of the first layer of the third conductive layer in the Z direction may be about 300 angstroms, a thickness of the second layer in the Z direction may be about 6000 angstroms, and a thickness of the third layer in the Z direction may be about 700 angstroms, but the present disclosure is not limited thereto.

The data line 171 may contact, and may be electrically connected to, the conductive region 141b of the semiconductor layer 140 of the second transistor T2 through a contact hole of the second insulating layer 118.

The driving voltage line 172 may contact, and may be electrically connected to, the third conductive pattern 133 of the second conductive layer 130 through contact holes of the second insulating layer 118 and the buffer layer 116. The second portion 120b of the first conductive layer 120 may form a first end of the second capacitor Chold of FIG. 2 described above, and the third conductive pattern 133 may form a second end of the second capacitor Chold.

The connection electrode 170 may contact, and may be electrically connected to, each of the gate electrode 161 of the first transistor T1 and the conductive region 143a of the semiconductor layer 140 through a plurality of contact holes in the second insulating layer 118, and may contact, and may be electrically connected to, the first conductive layer 120 through contact holes formed in the second insulating layer 118, the buffer layer 116, and the first insulating layer 114. Accordingly, as illustrated in FIG. 2 described above, the gate electrode 161, which is the second gate terminal of the first transistor T1, may be electrically connected to the conductive region 143a serving as the second terminal of the first transistor T1 and the first portion 120a of the first conductive layer 120 forming the first end of the first capacitor Cst.

The connection electrode 176 may contact, and may be electrically connected to, the first conductive pattern 131 of the second conductive layer 130 through contact holes of the second insulating layer 118 and the buffer layer 116. The connection electrode 177 may contact, and may be electrically connected to, the gate electrode 162 of the second transistor T2 through the contact hole of the second insulating layer 118. The connection electrode 176 and the connection electrode 177 may be electrically connected to each other to form a dual-gate structure of the second transistor T2.

The connection electrode 178 may contact, and may be electrically connected to, the conductive region 143b of the semiconductor layer 140 of the second transistor T2 through the contact hole of the second insulating layer 118, and may contact, and may be electrically connected to, the second conductive pattern 132 of the second conductive layer 130 forming the first gate terminal of the first transistor T1 through the contact holes of the second insulating layer 118 and the buffer layer 116.

The connection electrodes 179 may contact, and may be electrically connected to, the conductive region 141a of the semiconductor layer 140 of the first transistor T1 through a contact hole of the second insulating layer 118. The connection electrode 179 may be electrically connected to the conductive region of the fifth transistor T5.

The third conductive layer may be located directly on the second insulating layer 118 to contact an upper surface of the second insulating layer 118.

A third insulating layer 180 may be located on the third conductive layer. The third insulating layer 180 may have a single-layer or multi-layered structure. The third insulating layer 180 may include a general-purpose polymer, such as pol(methyl methacrylate PMMA or polystyrene PS, a polymer derivative having a phenolic group, an organic insulating material, such as an acrylic polymer, an imide polymer, a polyimide, an acrylic polymer, a siloxane polymer, etc.

A plurality of pixel electrodes 190 may be positioned on the third insulating layer 180. The pixel electrodes 190 may function as an anode of the light emitting diode LD illustrated in FIG. 2. The pixel electrodes 190 may contact, and may be electrically connected to, the connection electrode 170 through a contact hole of the third insulating layer 180. Accordingly, the pixel electrodes 190 may be connected to the gate electrode 161 of the first transistor T1 and the first capacitor Cst to receive an output voltage. The pixel electrodes 190 may include at least one of conductive oxides, such as ITO, IZO, ZnO, IGO, and AZO, silver (Ag), magnesium (Mg), aluminum (Al), platinum (Pt), palladium (Pd), gold (Au), nickel (Ni), neodymium (Nd), iridium (Ir), chromium (Cr), or a compound thereof.

The pixel electrodes 190 may be positioned directly on the third insulating layer 180 to contact an upper surface of the third insulating layer 180.

A fourth insulating layer 200 may be located on the pixel electrodes 190 and the third insulating layer 180. The fourth insulating layer 200 has/defines an opening positioned in the pixel electrodes 190, and is also referred to as a partition wall. A spacer 202 protruding in the Z direction may be positioned above the fourth insulating layer 200. The spacer 202 may be integrally formed with the fourth insulating layer 200. The spacer 202 may reduce or prevent the likelihood of engraving caused by a mask.

The fourth insulating layer 200 may be formed by spin coating or the like using an organic insulating material, such as polyimide, polyamide, acrylic resin, benzocyclobutene, hexamethyldisiloxane HMDSO, or phenol resin.

An emission layer 210 may be located in an opening of the fourth insulating layer 200. The emission layer 210 may include at least one of an organic light emitting material or quantum dots. According to one or more embodiments, the organic light emitting material may include a low molecular weight organic compound or a high molecular weight organic compound. The quantum dots may include a core including a Group II-VI compound, a Group III-V compound, a Group IV-VI compound, a Group IV element, a Group IV compound, and a combination thereof. According to one or more embodiments, the quantum dots may have a core-shell structure including a core, and a shell surrounding the core. The shell may include, for example, an oxide of a metal or a non-metal, a semiconductor compound, and a combinations thereof.

A common electrode 220 may be positioned on the fourth insulating layer 200 and the emission layer 210. The common electrode 220 may function as the cathode of the light emitting diode LD described above.

The pixel electrode 190, the emission layer 210, and the common electrode 220 constitute the light emitting diode LD.

A cross-sectional structure of the fan-out portion FOP in the peripheral area PA of the display device according to one or more embodiments will be described with reference to FIG. 4 and FIG. 5 along with the drawings described above.

Figure 4:
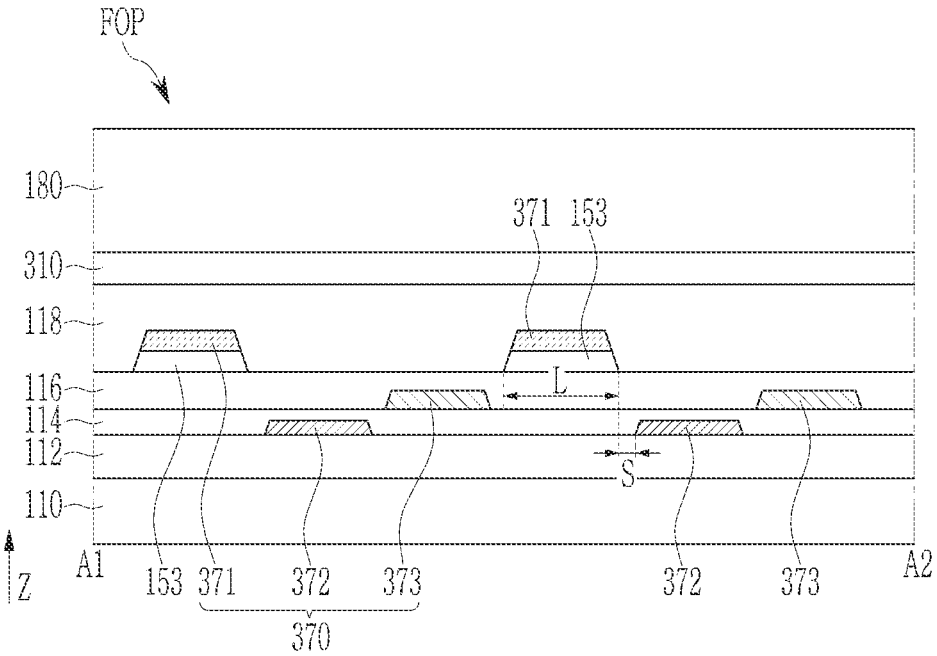
FIG. 4 illustrates a cross-sectional view of a peripheral area of a display device, which is a cross-sectional view taken along the line A1-A2 of FIG. 1 according to one or more embodiments.
Figure 5:
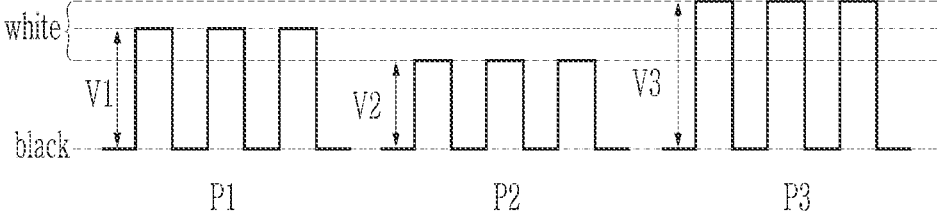
FIG. 5 illustrates a range of a data voltage inputted to a plurality of pixels of a display device according to one or more embodiments.

FIG. 4 illustrates a cross-sectional view of a peripheral area of a display device, which is a cross-sectional view taken along the line A1-A2 of FIG. 1 according to one or more embodiments, and FIG. 5 illustrates a range of a data voltage inputted to a plurality of pixels of a display device according to one or more embodiments.

Referring to FIG. 4, in the fan-out portion FOP, the barrier layer 112, the first conductive layer, the first insulating layer 114, the second conductive layer, the buffer layer 116, the gate insulating layer 153, the gate conductive layer, the second insulating layer 118, the third conductive layer, and the third insulating layer 180 may be sequentially located on the substrate 110 as in the display area DA.

The first fan-out wire 371 and the second fan-out wire 372 are included in the fan-out wires 371, 372, and 373 positioned in the fan-out portion FOP. In addition, the third fan-out wire 373 is positioned in different conductive layers on the substrate 110. For example, the fan-out wires 371, 372, and 373 may be separately arranged in different conductive layers positioned between the second insulating layer 118 and the barrier layer 112. For example, the first fan-out wire 371 is positioned in a gate conductive layer positioned between the gate insulating layer 153 and the second insulating layer 118, the second fan-out wire 372 is positioned in a first conductive layer positioned between the barrier layer 112 and the first insulating layer 114, and the third fan-out wire 373 may be positioned in a second conductive layer positioned between the first insulating layer 114 and the buffer layer 116.

According to one or more other embodiments, the first to third fan-out wires 371, 372, and 373 may be positioned on different conductive layers among the first conductive layer, the second conductive layer, and the gate conductive layer, and an order thereof may be variously changed.

The first conductive layer may be located at a same layer as the first conductive layer 120 illustrated in FIG. 3, and may be a layer formed of a same material in a same process as the first conductive layer 120. The second conductive layer may be located at a same layer as the second conductive layer 130 illustrated in FIG. 3, and may be a layer formed of a same material in a same process as the second conductive layer 130. The gate conductive layer may be positioned at a same layer as the gate electrodes 161 and 162 shown in FIG. 3, and may be a layer formed of a same material in a same process as the gate electrodes 161 and 162. The gate insulating layer 153 is positioned on a same layer as the gate insulating layers 151 and 152 illustrated in

17

FIG. 3, and may be a layer formed of a same material in a same process as the gate insulating layers 151 and 152.

Referring to FIG. 4, a distance S in a plan view between adjacent fan-out wires 371, 372, and 373 may be greater than zero. A width L of each of the fan-out wires 371, 372, and 373 may be greater than a distance S between adjacent fan-out wires 371, 372, and 373 in a plan view, but the present disclosure is not limited thereto. According to one or more embodiments, the fan-out wires 371, 372, and 373 adjacent to each other in a plan view may overlap at least partially. In this case, the distance S between the adjacent fan-out wires 371, 372, and 373 in the plan view may be zero. The width L of each of the fan-out wires 371, 372, and 373 may be the same as or different from each other.

According to the present embodiments, because the adjacent fan-out wires 371, 372, and 373 positioned in the fan-out portion FOP are positioned on different conductive layers, the distance S between the adjacent fan-out wires 371, 372, and 373 may be further reduced, and thus an extension direction of the fan-out wires 371, 372, and 373 may be tilted closer to the X direction, and in FIG. 1, an area of the fan-out portion FOP positioned below the display area DA may be reduced. Accordingly, an area of a dead space that is an area in which an image is not displayed at a lower end of the display area DA may be reduced.

Referring to FIG. 1 and FIG. 5, voltage ranges of data signals transmitted by the data lines 171a, 171b, and 171c to which the first to third fan-out wires 371, 372, and 373 are respectively connected may be different from each other. That is, a data voltage range V1 of the data signal transferred to the first pixel P1 through the first data line 171a, a data voltage range V2 of the data signal transferred to the second pixel P2 through the second data line 171b, and a data voltage range V3 of the data signal transferred to the third pixel P3 through the third data line 171c may be different from each other. Herein, the data voltage ranges V1, V2, and V3 may be a difference between a voltage representing black, and a voltage representing white, in each of the pixels P1, P2, and P3. For example, when the first pixel P1 represents red, the second pixel P2 represents green, and the third pixel P3 represents blue, the data voltage range V2, the data voltage range V1, and the data voltage range V3 may gradually increase in that order, but the present disclosure is not limited thereto. The data voltage ranges V1, V2, and V3 may vary depending on conditions of a pixel circuit and a light emitting diode of each of the corresponding pixels P1, P2, and P3.

According to one or more embodiments, the fan-out wires 371, 372, and 373 may be positioned in different conductive layers depending on a magnitude of the data voltage range of the data signal transferred by each of the data lines 171a, 171b, and 171c to which the different fan-out wires 371, 372, and 373 are respectively connected. That is, as the data voltage ranges transferred by the fan-out wires 371, 372, and 373 increases, resistance of the conductive layers in which the fan-out wires 371, 372, and 373 are positioned may decrease. Accordingly, it is possible to equalize filling rates of the data lines 171a, 171b, and 171c and to improve a data filling rate.

For example, as described above, when sheet resistance or specific resistance decreases in the order of the first conductive layer, the gate conductive layer, and the second conductive layer, the third fan-out wire 373 that transfers a data signal having a largest data voltage range is positioned in the second conductive layer, the first fan-out wire 371 that transfers a data signal having a next largest data voltage range is positioned in the gate conductive layer, and the second fan-out wire 372 that transfers a data signal having a smallest data voltage range may be positioned in the first conductive layer. An arrangement order of the first to third fan-out wires 371, 372, and 373 is not limited to that illustrated in FIG. 4, and may be changed.

Referring to FIG. 4, the third conductive layer positioned on the second insulating layer 118 may include the first voltage line 310. That is, the first voltage line 310 may be positioned on the second insulating layer 118. Similarly, the second voltage line 320 illustrated in FIG. 1 may be positioned in the third conductive layer on the second insulating layer 118.

Referring to FIG. 1, FIG. 3, and FIG. 5, between the display area DA and the fan-out portion FOP, the data lines 171a, 171b, and 171c may be electrically connected to the respective fan-out wires 371, 372, and 373 positioned in different conductive layers through contact holes of the first insulating layer 114, the buffer layer 116, and the second insulating layer 118.

While embodiments of the present disclosure have been described in connection with what is presently considered to be practical embodiments, it is to be understood that the present disclosure is not limited to the disclosed embodiments, but, on the contrary, is intended to cover various modifications and equivalent arrangements included within the spirit and scope of the appended claims, with functional equivalents thereof to be included therein.

DESCRIPTION OF SYMBOLS

| | |
|---|---|
| 110: substrate | 112: barrier layer |
| 114, 118, 180, 200: insulating layer | 116: buffer layer |
| 120, 130: conductive layer | 120a: first portion |
| 120b: second portion | 131, 132, 133: conductive pattern |
| 140: semiconductor layer | 141a, 141b, 143a, 143b: conductive region |
| 142a, 142b: channel region | 151, 152, 153: gate insulating layer |
| 161, 162: gate electrode | 170, 176, 177, 178, 179: connection electrode |
| 171, 171a, 171b, 171c: data line | 172: driving voltage line |
| 173: common voltage line | 174: reference voltage line |
| 175: initialization voltage line | 190: pixel electrode |
| 202: spacer | 210: emission layer |
| 220: common electrode | 310, 320: voltage line |
| 315, 325, 375: pad | 371, 372, 373: fan-out wire |
| 500: driver | 600: signal controller |
| 700: processor | 1000: display device |
| Cst: first capacitor | Chold: second capacitor |
| DA: display area | FOP: fan-out portion |
| P1, P2, P3, PX: pixel | PA: peripheral area |
| PAD: pad portion | |

What is claimed is:

1. A display device comprising:

a substrate comprising a display area comprising pixels and signal lines; and a peripheral area around the display area and comprising a fan-out portion comprising a first fan-out wire, a second fan-out wire, and a third fan-out wire connected to respective ones of the signal lines;

a semiconductor layer above the substrate;

a first conductive layer between the semiconductor layer and the substrate, and comprising the second fan-out wire;

a second conductive layer between the first conductive layer and the semiconductor layer, and comprising the third fan-out wire;

a buffer layer above the second conductive layer;

a gate-insulating layer above the buffer layer;

a gate conductive layer above the semiconductor layer and on the gate-insulating layer, and comprising the first fan-out wire; and a third conductive layer above the gate conductive layer, wherein the semiconductor layer comprises a channel region disposed in the display area, wherein the first conductive layer comprising the second fan-out wire and the second conductive layer comprising the third fan-out wire are disposed between the buffer layer and the substrate, wherein the second conductive layer comprises a first conductive pattern overlapping the channel region in the display area, and wherein the first conductive layer comprises a first portion disposed in the display area and overlapping the first conductive pattern to form a first capacitor.

2. The display device of claim 1, wherein a first voltage range of a signal transferred by the first fan-out wire, a second voltage range of the signal transferred by the second fan-out wire, and a third voltage range of the signal transferred by the third fan-out wire are different from each other.

3. The display device of claim 2, wherein the first conductive layer, the second conductive layer, and the gate conductive layer have different sheet resistances or specific resistances, respectively.

4. The display device of claim 3, wherein the sheet resistances or the specific resistances decrease in order of the second fan-out wire, the first fan-out wire, and the third fan-out wire, and wherein the voltage ranges increase in an order of the second voltage range, the first voltage range, and the third voltage range.

5. The display device of claim 4, wherein the sheet resistances or the specific resistances decrease in an order of the first conductive layer, the gate conductive layer, and the second conductive layer.

6. The display device of claim 4, wherein a color displayed by a pixel connected to a first signal line to which the first fan-out wire is connected, a color displayed by a second pixel connected to a second signal line to which the second fan-out wire is connected, and a color displayed by a third pixel connected to a third signal line to which the third fan-out wire is connected, are different from each other.

7. The display device of claim 6, wherein the first pixel is configured to display green, the second pixel is configured to display red, and the third pixel is configured to display blue.

8. The display device of claim 1, wherein the third conductive layer comprises a voltage line positioned in the fan-out portion and configured to transmit a driving voltage to the display area.

9. The display device of claim 1, wherein any other conductive layer than the first conductive layer, the second conductive layer, and the gate conductive layer is not positioned between the substrate and the third conductive layer.

10. The display device of claim 1, further comprising a light-emitting diode above the third conductive layer.

11. The display device of claim 1, wherein at least portions of the first conductive layer and the second conductive layer overlap the semiconductor layer in a plan view.

12. The display device of claim 11, wherein the first conductive layer further comprises a second portion connected to the first portion, and wherein the second conductive layer further comprises a second conductive pattern overlapping the second portion to form a second capacitor.

13. The display device of claim 12, wherein the gate conductive layer comprises a gate electrode overlapping the semiconductor layer, and wherein the gate electrode is electrically connected to the first conductive layer.

14. A display device comprising:

a substrate comprising:

a display area comprising:

pixels comprising a first pixel array, a second pixel array, and a third pixel array respectively representing different colors; and signal lines comprising a first signal line connected to the first pixel array, a second signal line connected to the second pixel array, and a third signal line connected to the third pixel array; and a peripheral area around the display area, and comprising a fan-out portion comprising:

a first fan-out wire in a gate conductive layer above the substrate, on a gate-insulating layer that is above a buffer layer, and connected to the first signal line;

a second fan-out wire in a first conductive layer above the substrate, below the buffer layer, and connected to the second signal line; and a third fan-out wire in a second conductive layer above the substrate, between the first conductive layer and the buffer layer, and connected to the third signal line.

15. The display device of claim 14, wherein a first voltage range of a signal transferred by the first fan-out wire, a second voltage range of the signal transferred by the second fan-out wire, and a third voltage range of the signal transferred by the third fan-out wire are different from each other.

16. The display device of claim 15, wherein the first conductive layer, the second conductive layer, and the gate conductive layer have different sheet resistances or specific resistances, respectively.

17. The display device of claim 16, wherein the sheet resistances or the specific resistances decrease in an order of the second fan-out wire, the first fan-out wire, and the third fan-out wire, and wherein the voltage ranges increase in an order of the second voltage range, the first voltage range, and the third voltage range.

18. The display device of claim 17, wherein the first pixel array is configured to display green, the second pixel array is configured to display red, and the third pixel array is configured to display blue.

19. A display device comprising:

a substrate comprising:

a display area comprising pixels and signal lines; and a peripheral area positioned around the display area, and comprising a fan-out portion in which fan-out wires are connected to the signal lines to transmit signals of different voltage ranges; and a first conductive layer above the substrate;

a second conductive layer above the first conductive layer;

a buffer layer above the second conductive layer;

a gate-insulating layer above the buffer layer; and a gate conductive layer positioned above the substrate and on the gate-insulating layer, wherein the first conductive layer, the second conductive layer, and the gate-insulating layer have respective sheet resistances or specific resistances, and wherein the fan-out wires are positioned on respective ones among the first conductive layer, the second conductive layer, and the gate conductive layer depending on a magnitude of voltage ranges of the signals respectively transferred by the fan-out wires.

20. The display device of claim 19, wherein the sheet resistances or the specific resistances of the fan-out wires, respectively, are inversely proportional to respective voltage ranges of signals transferred by the fan-out wires.

* * * * *